United States Patent [19]

Woods

[11] 4,333,565

[45] Jun. 8, 1982

[54] ANTI-STATIC PACKAGE FOR ELECTRONIC CHIPS

[76] Inventor: Larry N. Woods, 409 N. Rockborough Ct., Stone Mountain, Ga. 30083

[21] Appl. No.: 238,946

[22] Filed: Feb. 27, 1981

[51] Int. Cl.³ ...................... B65D 73/02; B65D 85/30
[52] U.S. Cl. .................................. 206/329; 206/472; 206/591; 206/820
[58] Field of Search ............... 206/329, 334, 328, 591, 206/523, 232, 820, 472

[56] References Cited

U.S. PATENT DOCUMENTS 2,962,161  11/1960  Lacy ..................................... 206/329
4,274,537  6/1981  Cooper ................................ 206/329

Primary Examiner—William T. Dixson, Jr.
Attorney, Agent, or Firm—James A. Hinkle

[57] ABSTRACT

A package for storage, transportation and field use of microcircuit devices which inhibits electrostatic charge buildup on the devices. The package provides a magazine enclosing an electrically conductive pad into which the microcircuit terminals are set to short-circuit the static charge on the terminals. The magazines may be ganged together in a continuous strip to facilitate shipping.

2 Claims, 5 Drawing Figures

U.S. Patent  Jun. 8, 1982  4,333,565
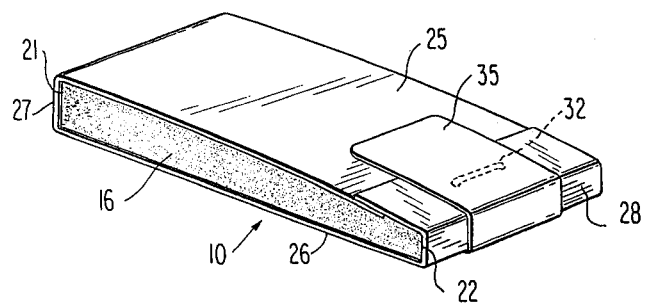
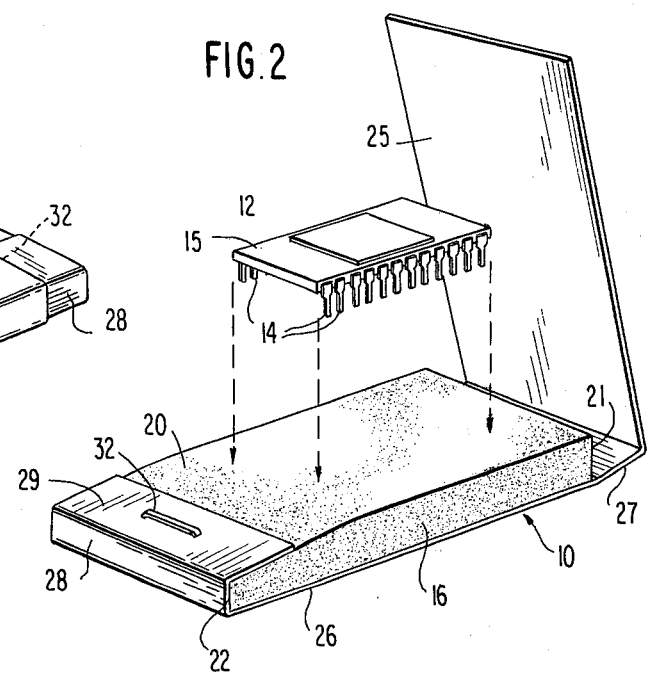
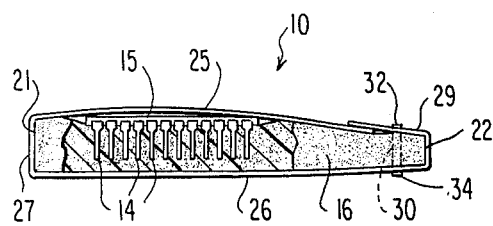
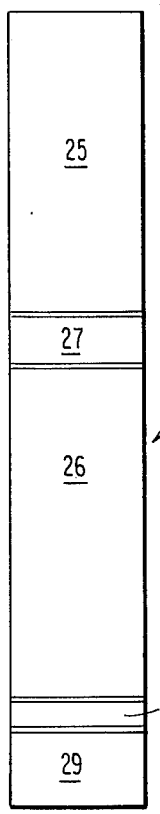
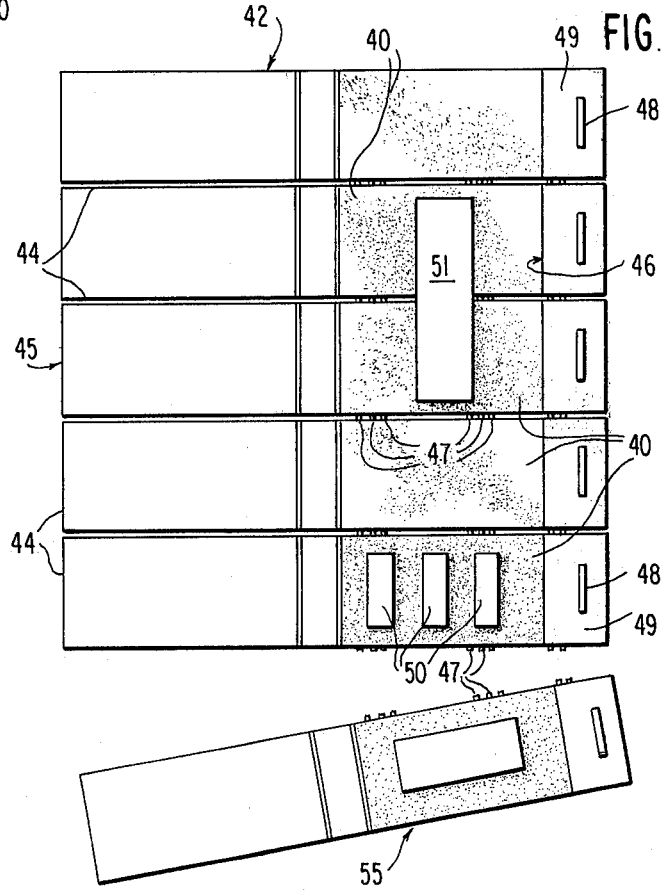

ANTI-STATIC PACKAGE FOR ELECTRONIC CHIPS

BACKGROUND OF THE INVENTION

Today a number of electronic devices exist which are sensitive to static electricity. Microcircuit devices such as integrated circuit chips, for example, may be damaged by electrostatic discharge prior to their incorporation into electrical or eectronic equipmet.

In order to prevent electrostatic breakdowns magazines, in which such devices are stored, have been provided with means for short-circuiting the device terminals or pins during storage. This short-circuiting serves to prevent the accumulation of potentially damaging static charges. As exemplified in U.S. Pat. No. 4,171,049 some of these magazine have taken the form of elongated cases made of metal or conductive resins. They often have a series of conductive slots or grooves into which a number of static electricity sensitive devices may be serially inserted and later serially dispensed to manufacturing equipment. Other magazines have been developed for portable field use as in the device replacement market. These have taken the form of small, box-like magazines that house conductive sponge sheets into which the device terminals may be temporarily embedded. The present invention relates more closely to this latter type of magazine.

For the storage and transportation to field use of such devices their magazine should possess several characteristics or capabilities some of which are quite different from features of magazines associated with manufacturing equipment. For example, besides possessing the ability to inhibit electrostatic charge buildup they should also provide protection from mechanical shock and vibration. Furthermore, they should be of light weight construction and easy to use in gaining and restricting access. Another desirable feature is the capability of storing static sensitive devices of difference sizes and shapes without an attendant size change in the magazines themselves. Reuseability and tamper security are still other desirable qualities. And, as ever, cost economy is also important.

Unfortunately, magazines of the prior art for the storage and transport of static electricity sensitive devised to field use have been lacking in a number of the just described traits. This may be attributable to the fact that the majority have been specifically designed for on-line use in the manufacture of electronic equipment and systems. Usually they, as would be expected, actually guard against universality in order to avoid error. This is to say that they often insure that only one type or size device may be inserted and stored in order to prevent an incorrect device from being incorporated into electronic equipment. Usually they are relatively heavy and, being equiped with attachment means, are also bulky. On the other hand those magazines that have heretofore been constructed with field use in mind, though lighter and smaller, have still not possessed sufficient lightness in weight. Most have also been incapable of efficiently housing devices of different sizes and shapes. Secure identification of several items packaged in one unit, accompanied by individual access capability, has also been lacking.

Accordingly, it is a general object of the present invention to provide an improved magazine for static electricity sensitive devices.

More specifically, it is an object of the invention to provide a magazine for shipping and storing static electricity sensitive devices.

Another object of the invention is to provide a magazine of the type described of simple, light weight and economic construction.

Yet another object of the invention is to provide a magazine of the type described that is capable of efficiently housing devices of different sizes and shapes.

Still another object of the invention is to provide a magazine of the type described in which several devices may be stored yet individually identified, secured and later removed.

SUMMARY OF THE INVENTION

In one preferred form of the invention a magazine is provided for a static electricity sensitive device of the type having a plurality of electrical terminals depending from a thin body. The magazine comprises an electrically conductive pad having opposed top and bottom surfaces conjoined with opposing side surfaces and opposing end surfaces with the thickness of the pad between the pad top and bottom surfaces being sufficient to accomodate the device terminals upon being embedded therein. A cover is wrapped about the pad top, bottom and end surfaces and sized to present end portions in mutually overlapping relation atop the pad top surface. A staple fastens the cover to the pad with a staple bight overlaying one of the cover ends and portions from which two staple legs extend completely through the pad and the other one of the cover end portions.

In another preferred form of the invention a magazine is provided for static electricity sensitive devices of the type having a plurality of electrical terminals depending from thin bodies. The magazine comprises a row of electrically conductive pads juxtaposed side by side with mutually coplanar top, bottom and end surfaces and with the thickness of each pad being sufficient to accomodate the device terminals upon being embedded therein. A cover is wrapped about the row of pads overlaying the pads top, bottom and end surfaces and sized to present end portions in mutually overlapping relation atop the pads top surfaces and with the cover having score lines adjacent confronting sides of adjacent pads in the row of pads. The magazine also includes means independently fastening each of the pads to the cover between the score lines.

While the preferred form of the invention utilizes staples as the fastening means for affixing the cover to the conductive pad, another preferred form of fastening is to extrude a cover from a suitable flexible plastic into a match book type cover. The re-entrant bottom clip portion that holds the foam pad would be so designed that it would function as a clip to hold the foam pad under pressure without any additional fastening means.

BRIEF DESCRIPTION OF THE DRAWING

FIG. 1 is a perspective view of a magazine embodying principles of the invention shown in a closed, sealed position.

FIG. 2 is a perspective view of the magazine illustrated in FIG. 1 shown in an unsealed, open position.

FIG. 3 is a cross-sectional view of the magazine illustrated in FIG. 1 shown in an unsealed, closed position housing a microcircuit device.

FIG. 4 is a plan view of the cover component of the magazine illustrated in FIG. 1 shown in a blank configuration.

FIG. 5 is a plan view of another magazine embodying principles of the invention shown in an open position.

DETAILED DESCRIPTION

Referring now in more detail to the drawing there is shown in FIGS. 1-4 a magazine 10 for an integrated circuit chip 12 having a set of terminals or lead pins 14 that depend from a flat body 15. The magazine comprises a pad 16 made of an electrically conductive loaded plastic foam such as carbon or aluminum loaded polyurethane foam. This is a commercially available volume conductive type material that is electrically conductive throughout. Alternatively the pad could be provided by a surface conductive type material such as that known as antistatic "pink poly". This latter type is a polyethylene impregnated with an organic liquid which holds moisture on its surface to render it conductive.

Another type of conductive surface is a polyethylene film, or foam material, sprayed with a conductive carbon, or similar conductive substance, solution to effect a conductive layer on the surface of the material.

With continued reference to the drawing the magazine is seen to further include a cover 18 which initially is in the form of a rectangular blank as shown in FIG. 4. The cover is wrapped about the pad 16 so as to overlay its top surface 20, its bottom surface opposite the top surface, and its end surfaces 21 and 22. Once mounted to the pad in this manner the cover has a top panel 25 conjoined with a bottom panel 26 by an end panel 27 and a flap-like panel 29 conjoined with bottom panel 26 by another end panel 28. The width of the cover 18 here substantially matches the width of the pad 16. The length of the cover is such as to have end portions thereof overlap one another once wrapped about the pad. In other words the flap-like panel 29 may then be positioned so as to overlap an end portion of the cover panel 25 as shown in FIGS. 1 and 3. The cover itself is preferably formed of plastic coated paper or cardboard.

The cover 18 is fastened to the pad 16 by means of a staple. The staple is applied so as to have its two legs 30 extend from a bight 32 overlaying the cover flap-like panel 29 completely through the pad and the cover bottom panel 26. The staple in-turned feet 34 then underlay the bottom panel 26. In applying the staple the pad may be compressed slightly as shown in FIG. 3. In the embodiment illustrated though the length of the two legs 30 generally approximates the length of the device terminals 14.

In an alternative embodiment, it is believed that the cover 18 may be extruded from a flexible plastic material so that the end panel 28 and the re-entrant flap panel 29 would be so extruded to pre-form a clip that would engage the pad 16 in an compression fit to eliminate the need for the staple. Such an alternative is considered well within the scope of the present invention.

With the cover now fastened to the pad the cover top panel 25 may be lifted off the pad and the microcircuit device 12 then mounted to the pad as illustrated in FIG. 2. In doing so the several terminals 14 of the device are easily embedded in the pad leaving its thin body 15 seated upon the top surface of the pad. With the device terminals now short-circuited the cover top panel 25 may be closed by slightly bending and inserting it underneath the flap-like panel 27. Following this an adhesive label 35 may be placed over the overlapping portions of the cover thereby sealing the magazine. If desired the label may bear printed indicia identifying the particular device while the cover may be marked with a static-sensitivity warning.

With reference next to FIG. 5 a magazine embodying principles of the invention in another form is seen to comprise a plurality of independent, electrically conductive pads 40 juxtaposed in a side-by-side relationship to form a suitable length, or roll, of the pads, as indicated by numeral 42.

The covers 44 are attached to one another, at their respective sides by perforations 47. Such a continuous side-by-side arrangement allows the microcircuit devices to be packaged in a variety of configurations, and allows packaging in continuous rows or a continuous roll. In the embodiment shown in FIG. 5, the pads 40 are connected to the covers 44 by the staples 48 overlaying the flap-like end portions 49.

With the configuration of FIG. 5 several microcircuit devices of different sizes and shapes may be packaged, sealed and shipped in one magazine with independent removal and partitioning capability retained. For example, three small devices 50 are here shown mounted atop one pad while a device 51 that is larger than the top surface of any single pad is seen mounted so as to bridge two of the pads. When this is done a label may be mounted so as to seal and identify the second and third pads, as counted downwardly in the Figure, without also sealing the others. Then another label can seal and identify the three devices 50 housed atop the fifth pad. Later the several pads may be selectively accessed with the entire cover remaining in tact. Alternatively, the cover may be easily partitioned as illustrated by the additional section 55 shown and illustrated as having its cover bridges or links severed.

It thus is seen that a versatile magazine is indeed provided of simple, light weight and economic construction for the storage and transportation of static electricity sensitive devices. It is capable of efficiently housing devices of different sizes and shapes while retaining individual device identification, security and access. Its use may eliminate the separate handling in the field of overpack containers. Being recloseable it is reuseable which avoids the waste of expensive conductive foam material.

It should be understood that the just described embodiments merely illustrate principles of the invention in selected, preferred forms. Many modifications, additions and deletions may be made thereto without departure from the spirit and scope of the invention as set forth in the following claims.

What is claimed is:

1. A magazine for a static electricity sensitive device of the type having a plurality of electrical terminals depending from a thin body, said magazine comprising an electrically conductive pad, said pad being comprised of a carbon black impregnated high density polyurethane foam, the magazine pad further having opposed top and bottom surfaces joined with opposing end and side surfaces to form a unitary pad, the thickness of the pad between the pad top and bottom surfaces being sufficient to accomodate the electrical terminals of the device upon being embedded therein, a cover having two free ends wrapped about said pad top, bottom and end surfaces and sized to present end portions in mutually overlapping relation atop said pad top surface; said cover being wrapped about said pad top, bottom and end surfaces wherein the two free ends overlap on said top surface in a reentrant manner to apply clamping pressure to said pad, means fastening said cover to said pad comprising a staple having a bight overlaying one of the cover end portions from which two staple legs extend completely through said pad and the bottom surface of said cover.

2. A magazine for static electrically sensitive devices of the type having a plurality of electrical terminals depending from thin bodies, said magazine comprising a row of electrically conductive pads jaxtaposed side by side with mutually coplanar top, bottom and end surfaces and with the thickness of each pad being sufficient to accomodate the terminals of the device upon being embedded therein, said agazine comprisig an electrically conductive pad, said pad being comprised of a carbon black impregnated high density polyurethane foam, a cover having two free ends wrapped about said row of pads overlaying said pads top, bottom and end surfaces and sized to present end portions in mutually overlapping relation atop said pads top surfaces and with said cover having score lines adjacent confronting sides of adjacent pads in said row of pads, the free ends of said cover atop the pads top surfaces overlap in a reentrant manner to apply clamping pressure to said pads, means independently fastening each of said pads to said cover between said score lines comprising a row of staples with a bight portion of each staple overlaying one of said cover end portions from which bight two steple leg portions extend completely through one of said pads and the other one of said cover end portions.

* * * * *